US006057235A

United States Patent [19]

Leiphart et al.

[11] Patent Number: 6,057,235

[45] Date of Patent: May 2, 2000

[54] METHOD FOR REDUCING SURFACE CHARGE ON SEMICONDUCTER WAFERS TO PREVENT ARCING DURING PLASMA DEPOSITION

[75] Inventors: Shane P. Leiphart; Randle D. Burton, both of Boise, Id.

[73] Assignee: Micron Technology, Inc., Boise, Id.

[21] Appl. No.: 08/929,476

[22] Filed: Sep. 15, 1997

[51] Int. Cl.$^{7}$ .................................................... H01L 21/00

[52] U.S. Cl. ...................................... 438/680; 118/723 R

[58] Field of Search ........................ 438/680; 118/723 R, 118/723 E

[56] References Cited

U.S. PATENT DOCUMENTS

| | | | |
|---|---|---|---|
| 5,228,501 | 7/1993 | Tepman, et al. . | |
| 5,292,399 | 3/1994 | Lee et al. | 156/643 |
| 5,561,585 | 10/1996 | Barnes, et al. . | |
| 5,587,207 | 12/1996 | Gorokhovsky | 427/571 |

OTHER PUBLICATIONS

John L. Vossen and Werner Kern, Thisn Film Processes II, pp. 177–275, 1991.

Catherine M Cotel et al., ASM Handbook, vol. 5, Surface Engineering, pp. 497–611, 1994.

*Primary Examiner*—Charles Bowers
*Assistant Examiner*—Martin Sulsky
*Attorney, Agent, or Firm*—Killworth, Gottman, Hagan & Schaeff, L.L.P.

[57] ABSTRACT

A process of forming a layer of conductive material over a layer of insulating material is provided. A wafer is positioned on a wafer platform such that it is thermally and electrically coupled to the wafer platform. A clamping ring engages the peripheral edge of the wafer such that the wafer is held against the top surface of the wafer platform. The clamping ring is electrically coupled to the wafer pedestal. The wafer is exposed to a plasma comprising conductive material and an initial layer of conductive material is formed over the insulating layer until the top surface of the wafer is electrically coupled to the clamping ring. The wafer pedestal is then electrically biased and additional conductive material is formed. Once the initial layer of conductive material is electrically coupled to the clamping ring, the potential difference between the top and bottom surface of the wafer is zero such that arcing through the wafer is reduced. The wafer platform may also be exposed to the plasma so as to reduce the potential difference between the top and bottom surfaces of the wafer when the wafer platform is electrically biased.

17 Claims, 3 Drawing Sheets

METHOD FOR REDUCING SURFACE CHARGE ON SEMICONDUCTER WAFERS TO PREVENT ARCING DURING PLASMA DEPOSITION

BACKGROUND OF THE INVENTION

The present invention relates in general to the fabrication of semiconductor wafers, and, more particularly, to a method of reducing static electric charges on the surface of wafers resulting from plasma deposition.

Semiconductor processing requires the deposition of conductive materials on semiconductor wafers. Typically, plasma deposition, in the form of physical vapor deposition (PVD) or plasma enhanced chemical vapor deposition (PECVD), is used to deposit the conductive material on the semiconductor wafer as processing temperatures are significantly lower than non-plasma deposition methods. Plasma deposition is carried out in a plasma chamber with the wafer being secured on top of a wafer platform. Typically, the wafer is physically secured to the wafer platform by a clamping ring which engages an outer portion of the top surface of the wafer. The wafer platform is typically conductive so that the bottom surface of the wafer is electrically coupled to the wafer platform. The clamping ring is electrically coupled to the wafer platform such that the top surface of the wafer is also electrically coupled to the wafer platform.

An electrical bias is then applied to the wafer platform in order to control the plasma deposition process. The electrical bias sets up a negative potential on the wafer to attract the positive ions from the plasma. The topology of the formed layer is controlled by adjusting the applied electrical bias. Typically, the conductive material is applied over a layer of insulating material in order to form desired contacts, interconnects, or the like. While the clamping ring is electrically coupled to the wafer platform, the top surface of the wafer is not shorted to the wafer platform as the top surface of the wafer is insulated by the layer of insulating material. Once the plasma is generated, the top surface of the wafer is continually charged as the conductive material is deposited thereby forming a potential difference between the bottom surface of the wafer and the top surface of the wafer. This potential difference may lead to arcing through the wafer causing damage to one or more dies on the wafer.

Accordingly, there is a need for a process of depositing conductive materials over an insulating layer in which the risk of arcing through the wafer is reduced. Preferably, such a process would be inexpensive, easy to implement, would not entail excess processing steps, and would not adversely affect the quality of the deposited conductive layer.

SUMMARY OF THE INVENTION

The present invention meets this need by providing a method in which an initial layer of conductive material is deposited over the insulating layer prior to electrically biasing the wafer platform. The initial layer is preferably continuous so that the top surface of the wafer contacts the clamping ring, thereby, shorting the top surface to the wafer platform. Once the initial layer of conductive material is formed, the wafer platform is electrically biased to control the growth of the rest of the conductive layer. The present invention also meets this need by providing a method in which the wafer platform is exposed to the plasma so as to reduce the potential difference between the top and bottom surfaces of the wafer.

According to a first aspect of the present invention, a process of applying conductive material over a layer of insulating material on a semiconductor wafer in which a bottom surface of the wafer is electrically coupled to a wafer platform comprises forming a first layer of the conductive material over the insulating layer, the first layer of conductive material electrically coupling a top surface of the wafer to the wafer platform. The wafer platform is then electrically biased to a predetermined potential. A second layer of the conductive material is then formed over the first layer of conductive material. The conductive material may comprise a metallic material, such as a refractory metal, or semiconductor material. The first layer may have a thickness of at least 50 Angstroms and preferably, a thickness ranging from about 100 Angstroms to about 200 Angstroms. The insulating layer may be electrically coupled to the wafer platform by a clamping ring coupled to a portion of a top surface of the insulating layer and the wafer platform. The clamping ring is preferably electrically and physically coupled to the wafer platform. A portion of a top surface of the wafer platform may be substantially covered by the wafer and the clamping ring.

According to another aspect of the present invention, a process of applying conductive material over a layer of insulating material on a semiconductor wafer in which a bottom surface of the is electrically coupled to a wafer platform comprises exposing the wafer to a plasma including a conductive material. A substantially continuous first layer of the conductive material is formed over the insulating layer, the first layer of conductive material electrically coupling a top surface of the wafer to the wafer platform. The wafer platform is electrically biased to a predetermined potential, and a second layer of the conductive material is then formed over the first layer of conductive material. The step of exposing the wafer to a plasma including a conductive material may comprise the step of exposing a portion of the wafer platform to the plasma.

According to yet another aspect of the present invention, a process of applying conductive material over a layer of insulating material on a semiconductor wafer in which a bottom surface of the wafer is electrically coupled to a wafer platform comprises exposing the wafer to a plasma including a conductive material. A first layer of the conductive material is formed over the insulating layer until a top surface of the wafer is electrically coupled to the wafer platform. The wafer platform is electrically biased to a predetermined potential and a second layer of the conductive material is then formed over the first layer of conductive material.

According to a further aspect of the present invention, a process of applying conductive material over a layer of insulating material on a semiconductor wafer comprises positioning the wafer on a wafer platform such that a portion of a top surface of the wafer platform is exposed and a bottom surface of the wafer is electrically coupled to the wafer platform. The wafer and the wafer platform are exposed to a plasma including a conductive material to form a first layer of conductive material over the layer of insulating material on the wafer surface. The wafer platform is electrically biased to the wafer platform to a predetermined potential, and a second layer of the conductive material is then formed over the first layer of conductive material. The process may further comprise the step of securing the wafer to the wafer platform using a clamping ring engaging a portion of a top surface of the layer of insulating material. The process may further comprise the step of electrically coupling the clamping ring to the wafer platform.

According to a still further aspect of the present invention, a process of forming conductive material on a layer of insulating material on a semiconductor wafer comprises positioning the wafer on a wafer platform such that a bottom surface of the wafer is electrically coupled to the wafer platform. The wafer is secured to the wafer platform using a clamping ring engaging a portion of a top surface of the layer of insulating material. The clamping ring is then electrically coupled to the wafer platform. The wafer is exposed to a plasma including the conductive material and a first layer of the conductive material of at least 100 Angstroms is formed over the layer of insulating material. The first layer contacts the clamping ring such that a top surface of the wafer is electrically coupled to the wafer platform through the clamping ring. The wafer platform is then electrically biased to a predetermined potential, and a second layer of the conductive material is formed over first layer of the conductive material.

A process of fabricating a semiconductor wafer comprises providing a wafer having a substrate assembly which has at least one semiconductor layer. A layer of insulating material is formed over the at least one semiconductor layer. The wafer is then positioned on a wafer platform such that a bottom surface of the wafer is electrically coupled to the wafer platform. The wafer is secured to the wafer platform using a clamping ring engaging a portion of a top surface of the layer of insulating material. The clamping ring is electrically coupled to the wafer platform. The wafer is exposed to a plasma including a conductive material for forming a first layer of the conductive material over the layer of insulating material. The first layer contacts the clamping ring such that a top surface of the wafer is electrically coupled to the wafer platform through the clamping ring. The wafer platform is then electrically biased to a predetermined potential, and a second layer of the conductive material is formed over first layer of the conductive material.

Accordingly, it is an object of the present invention to provide a process of depositing conductive material over a layer of insulating material in which the risk of arcing through the wafer is reduced. It is a further object of the present invention to provide a process which is inexpensive, easy to implement, does not entail excess processing steps, and does not adversely affect the quality of the deposited conductive layer. Other features and advantages of the invention will be apparent from the following description, the accompanying drawings and the appended claims.

DETAILED DESCRIPTION OF THE PREFERRED EMBODIMENTS

Figure 1:
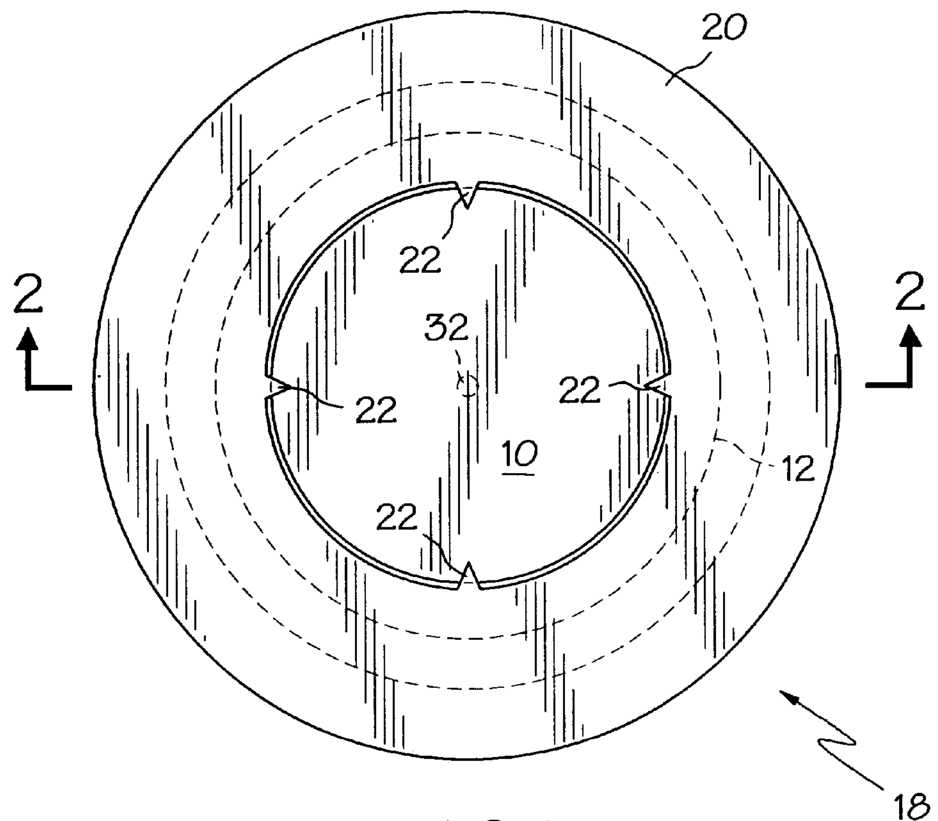
FIG. 1 is a plan view of a wafer platform with a wafer positioned thereon according to an embodiment of the present invention.
Figure 2:
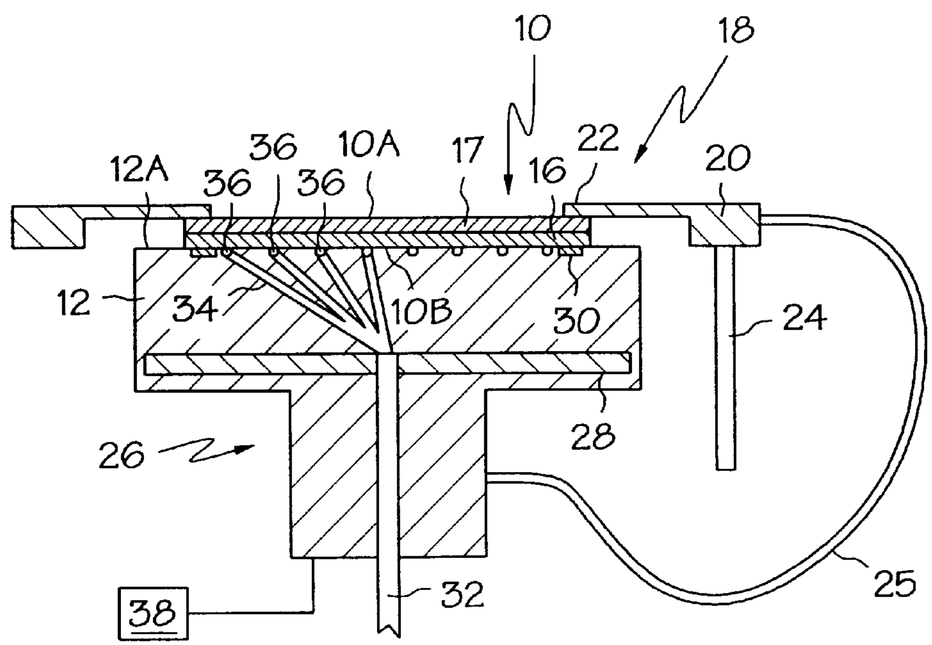
FIG. 2 is a cross-sectional side view of the wafer platform and wafer of FIG. 1.

Referring now to FIGS. 1 and 2, an embodiment of the present invention is shown. A semiconductor wafer 10 is shown mounted on a top surface 12A of a wafer platform 12. The wafer 10 includes a semiconductor layer 16, which is silicon in the illustrated embodiment, and may also include additional layers or structures which define active or operable portions of semiconductor devices (not shown). The wafer 10 may comprise a number of active semiconductor areas within and over the semiconductor layer 16 defining electronic components on one or more individual dies. The wafer 10 also comprises an insulating layer 17 formed over the semiconductor layer 16 and/or active semiconductor areas using conventional methods such that a top surface 10A of the wafer 10 is insulated. The wafer platform 12 comprises a conductive material, aluminum in the illustrated embodiment, which serves as a cathode in a plasma deposition chamber (not shown). In the illustrated embodiment, a plasma comprising a conductive material is generated for deposition over the insulating layer 17.

The wafer 10 is secured to the wafer platform 12 by a clamping ring mechanism 18 which comprises a clamping ring 20 having a plurality of clamping fingers 22 thereon. The clamping fingers 22 peripherally engage the top surface 10A of the wafer 10 and press it against the top surface 12A of the wafer platform 12. The clamping ring 20 ensures that a bottom surface 10B of the wafer 10 substantially engages the top surface 12A of the wafer platform 12. The clamping ring mechanism 18 also includes a drive mechanism 24 coupled to the clamping ring 20 for lowering and raising the clamping ring 20 into a clamped and unclamped position, respectively. The clamping ring 20 along with the clamping fingers 22 are composed of a suitable conductive material. The clamping ring 20 is electrically coupled to the wafer platform 12 by a shorting strap 25. Accordingly, the clamping ring 20 and the wafer platform 12 are maintained at the same potential. It will be appreciated by those skilled in the art that the clamping ring mechanism 18 may have a variety of different configurations.

As shown in FIG. 2, the wafer platform 12 includes a heater system 26 for heating the wafer 10. The heater system 26 includes a heater 28, a wafer seal ring 30, and a gas supply tube 32. The heater 28 is thermally coupled to the wafer platform 12 and is sized to sufficiently heat the wafer 10. The wafer seal ring 30 provides a seal around the bottom surface 10B of the wafer 10 to permit heat conductive gas, such as argon, to be circulated over the bottom surface 10B. The heat conductive gas is supplied through the gas supply tube 32 to a plurality of cylindrical bores 34. Each of the bores 34 connects to an associated radial groove 36 in the top surface 12A of the wafer platform 12. The wafer seal ring 30 provides a sufficient seal between the wafer 10 and the wafer platform 12 so that the wafer 10 is effectively thermally coupled to the wafer platform 12. The heater system 26 may also include a temperature measuring device (not shown) and a cooling system (not shown) for accurately regulating the temperature of the wafer 10. It will be appreciated by those skilled in the art that other systems may be used to heat the wafer 10 and to establish an effective thermal couple between the wafer 10 and the wafer platform 12.

Figure 3:
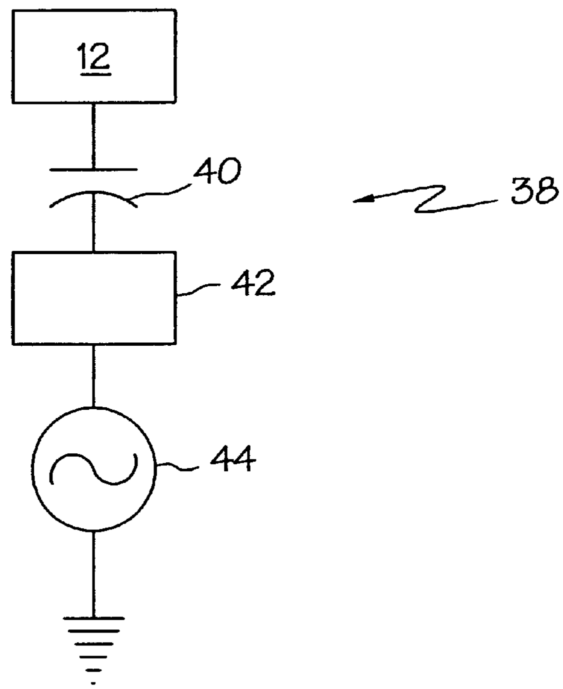
FIG. 3 is a schematic diagram of a bias circuit for the wafer platform of FIG. 1.

The bottom surface 10A of the wafer 10 is also electrically coupled to the wafer platform 12. As shown schematically in FIG. 3, the wafer platform 12 is electrically biased via a circuit 38. The circuit 38 includes a blocking capacitor 40, a matched network 42 and a power source 44. The power source 44 generates an A.C. or r.f. signal which is transmitted to the blocking capacitor 40 through the matched network 42. A desired D.C. voltage is developed across the blocking capacitor 40 which is present on wafer platform 12.

As the plasma comprising the conductive material comprises positively charged ions, the desired D.C. is preferably negative so as to attract these ions. The desired D.C. voltage may be changed by adjusting the magnitude of the A.C. or r.f. signal from the power source 44 so as to control the deposition of conductive material. While the voltage potential on the clamping ring 20 is the same as the voltage potential on the wafer platform 12, the top surface 10A of the wafer acts as a capacitor because of the insulating layer 17.

Figure 4:
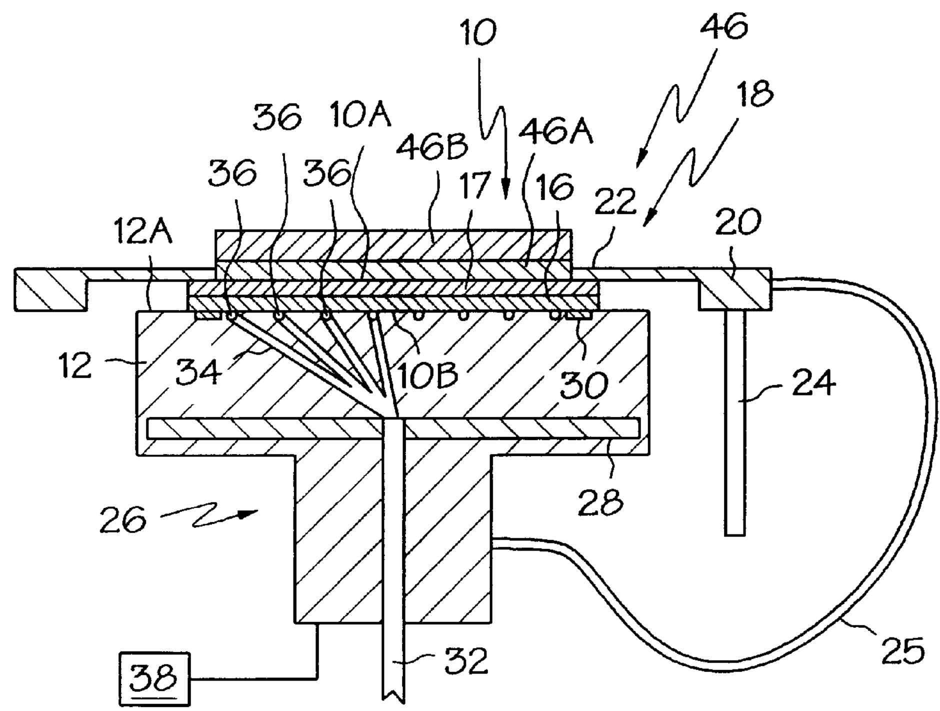
FIG. 4 is a cross-sectional side view of the wafer platform and wafer of FIG. 1 after deposition of a layer of conductive material.

A layer of conductive material 46 may be formed over the insulating layer 17 by first ensuring that a D.C. potential is not applied externally to the wafer platform 12. With the power source 44 off, the plasma comprising the conductive material is generated. As shown in FIG. 4, a first layer of conductive material 46A is formed over the insulating layer 17. The first layer 46A is grown until enough conductive material is deposited so as to form an electrical connection with the clamping ring 20. Once an electrical connection is formed, the top surface 10A of the wafer 10 is electrically coupled to the wafer platform 12 through the clamping ring 20 and the shorting strap 25. With the top surface 10A shorted to the wafer platform 12, the potential difference between the top surface 10A and the bottom surface 10B of the wafer 10 is zero so that arcing through the wafer 10 is eliminated. The power source 44 is then energized and a second layer of conductive material 46B is formed over the first layer 46A, thereby forming the layer 46 to the desired thickness. The topology of the layer 46 is then controlled by adjusting the magnitude of the A.C. or r.f. signal from the power source 44.

The conductive material may comprise any desired conductive material. Metallic materials, and particularly, refractory metals, and their alloys and compounds may be used to form the layer 46. For example, titanium or titanium nitride, may be used to form the layer 46, as titanium is commonly used to form interconnects between semiconductor components. Further, conductive semiconductor materials, such as doped polysilicon, may also be used to form the layer 46.

In the illustrated embodiment, at least 50 Angstroms, and typically, about 100 Angstroms to about 200 Angstroms of conductive material will be deposited over the insulating layer 17 prior to energizing the power source 44. It will be appreciated by those skilled in the art that the exact thickness of material which makes the top surface 10A conductive is dependent, in part, on the type of conductive material. The exact thickness is not important as long as the top surface 10A is conductive and shorted to the wafer platform 12 through the clamping ring 20 prior to electrically biasing the wafer platform 12. It should be apparent that the top surface 10A is sufficiently conductive once a substantially continuous layer of conductive material is formed.

Figure 5:
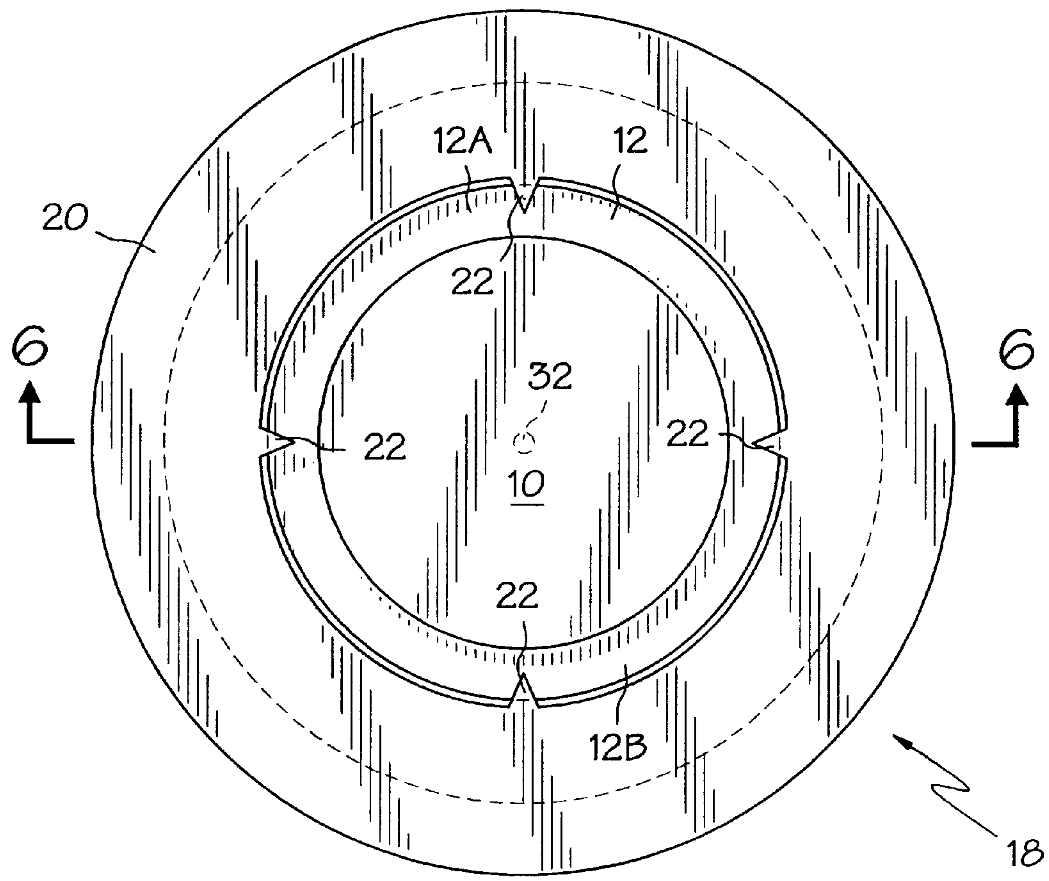
FIG. 5 is a plan view of a wafer platform with a wafer positioned thereon according to another embodiment of the present invention.
Figure 6:
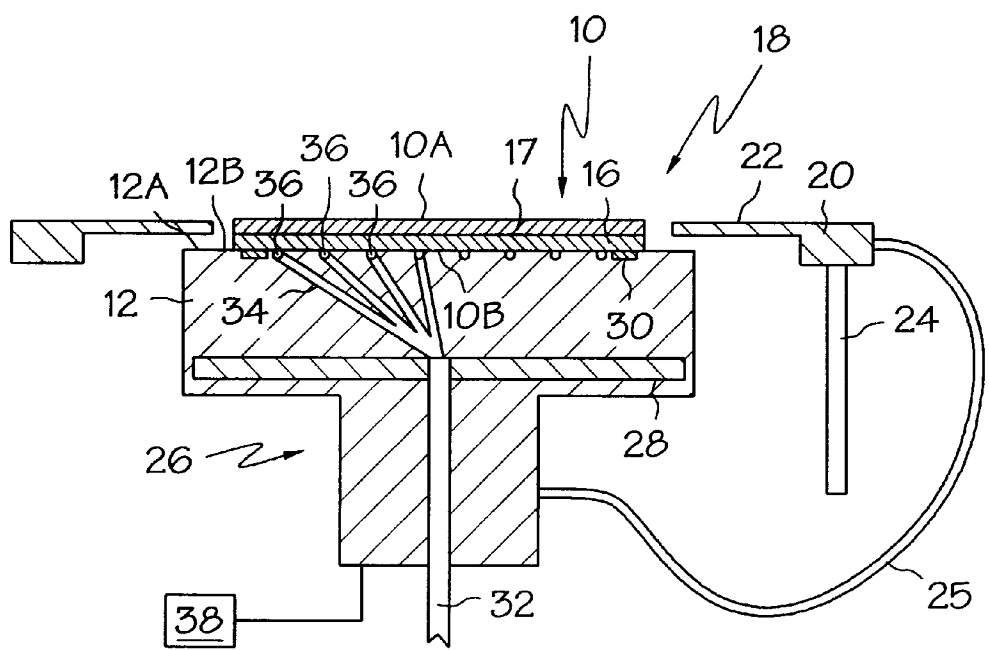
FIG. 6 is a cross-sectional side view of the wafer platform and wafer of FIG. 5.

Referring now to FIGS. 5 and 6, with like numbers corresponding to like numbers, another embodiment of the present invention is shown. In this embodiment, the wafer 10 is not heated but rather subjected to a r.f. bias. Correspondingly, the clamping ring 20 is not required to hold the wafer 10 against the wafer platform 12. The clamping ring 20 is removed from the wafer platform, spread outwards from the peripheral edge of the wafer 10 or is merely larger than the wafer 10, thereby exposing a portion 12B of the wafer platform 12 to the plasma. As the portion 12B of the wafer platform 12 is exposed to the plasma, the wafer platform 12 is charged along with the wafer 10, albeit at a slightly different rate. However, the potential difference between top surface 10A and the bottom surface 10B of the wafer 10 is not large enough to cause arcing through arcing. Consequently, the layer of conductive material 46 may be grown over the insulating layer 17 with the power source 44 energized from the start. The exposed portion 12B helps reduce the potential difference across the wafer 10 such that the risk of arcing is significantly reduced. It will be appreciated by those skilled in the art that the clamping ring 20 may be used to hold the wafer 10 against the wafer platform 12 as long as the clamping ring 20 is configured to expose the portion 12B to the plasma so that the potential difference across the wafer is reduced. The risk of arcing may be further reduced by combining both embodiments of the present invention with the portion 12B of the wafer platform 12 exposed to the plasma and a layer of conductive material 46A formed on the top surface 10A of the wafer prior to energizing the power source 44.

Having described the invention in detail and by reference to preferred embodiments thereof, it will be apparent that modifications and variations are possible without departing from the scope of the invention defined in the appended claims.

What is claimed is:

1. A process of applying conductive material over a layer of insulating material on a semiconductor wafer, wherein a bottom surface of said wafer is electrically coupled to a wafer platform, said process comprising:

forming a first layer of said conductive material over said insulating layer, said first layer of said conductive material electrically coupling a top surface of said wafer to said wafer platform;

then electrically biasing said wafer platform; and then forming a second layer of said conductive material over said first layer of conductive material.

2. The process of claim 1, wherein said conductive material comprises metallic material.

3. The process of claim 2, wherein said metallic material comprises a refractory metal.

4. The process of claim 1, wherein said conductive material comprises semiconductor material.

5. The process of claim 1, wherein said first layer has a thickness of at least 50 Angstroms.

6. The process of claim 1, wherein said first layer has a thickness ranging from about 100 Angstroms to about 200 Angstroms.

7. The process of claim 1, wherein said wafer is coupled to said wafer platform by a clamping ring which engages a portion of a top surface of said wafer and presses said wafer against said wafer platform.

8. The process of claim 7, wherein said clamping ring is electrically and physically coupled to said wafer platform.

9. The process of claim 8, wherein a portion of a top surface of said wafer platform is covered by said wafer and said clamping ring.

10. A process of applying conductive material over a layer of insulating material on a semiconductor wafer, wherein a bottom surface of said wafer is being electrically coupled to a wafer platform, said process comprising:

exposing said wafer to a plasma comprising said conductive material;

then forming a substantially continuous first layer of said conductive material over said insulating layer;

then electrically biasing said wafer platform; and then forming a second layer of said conductive material over said first layer of conductive material.

11. The process of claim 10, wherein the step of exposing said wafer to a plasma comprising said conductive material comprises the step of exposing a portion of said wafer platform to said plasma.

12. A process of applying conductive material over a layer of insulating material on a semiconductor wafer, wherein a bottom surface of said wafer is electrically coupled to a wafer platform, said process comprising:

exposing said wafer to a plasma comprising said conductive material;

then forming a first layer of said conductive material over said insulating layer until a top surface of said wafer is electrically coupled to said wafer platform;

then electrically biasing said wafer platform; and then forming a second layer of said conductive material over said first layer of conductive material.

13. A process of applying conductive material over a layer of insulating material on a semiconductor wafer, said process comprising:

positioning said wafer having said layer of insulating material thereon on a wafer platform such that a portion of a top surface of said wafer platform is exposed and a bottom surface of said wafer is electrically coupled to said wafer platform;

then exposing said wafer and said wafer platform to a plasma comprising said conductive material;

then forming a first layer of said conductive material over said layer of insulating material;

then electrically biasing said wafer platform; and then forming a second layer of said conductive material over said first layer of conductive material.

14. The process of claim 13, further comprising the step of securing said wafer to said wafer platform using a clamping ring, said clamping ring engaging a portion of a top surface of said layer of insulating material.

15. The process of claim 14, further comprising the step of electrically coupling said clamping ring to said wafer platform.

16. A process of forming conductive material on a layer of insulating material on a semiconductor wafer, said process comprising:

positioning said wafer on a wafer platform such that a bottom surface of said wafer is electrically coupled to said wafer platform;

securing said wafer to said wafer platform using a clamping ring, said clamping ring engaging a portion of a top surface of said layer of insulating material;

electrically coupling said clamping ring to said wafer platform;

exposing said wafer to a plasma comprising said conductive material;

forming a first layer of said conductive material of at least 100 Angstroms thickness over said layer of insulating material, said first layer of said conductive material contacting said clamping ring such that a top surface of said wafer is electrically coupled to said wafer platform through said clamping ring;

electrically biasing said wafer platform; and forming a second layer of said conductive material over first layer of said conductive material.

17. A process of fabricating a semiconductor wafer comprising:

providing a wafer having at least one semiconductor layer;

forming a layer of insulating material over said at least one semiconductor layer;

positioning said wafer on a wafer platform such that a bottom surface of said wafer is electrically coupled to said wafer platform;

securing said wafer to said wafer platform using a clamping ring, said clamping ring engaging a portion of a top surface of said layer of insulating material;

electrically coupling said clamping ring to said wafer platform;

exposing said wafer to a plasma of conductive material;

forming a first layer of said conductive material over said layer of insulating material, said first layer of said conductive material contacting said clamping ring such that a top surface of said wafer is electrically coupled to said wafer platform through said clamping ring;

electrically biasing said wafer platform; and forming a second layer of said conductive material over first layer of said conductive material.

* * * * *